(12) United States Patent
Smith et al.

(10) Patent No.: US 11,368,026 B2
(45) Date of Patent: Jun. 21, 2022

(54) POWER DISTRIBUTION ASSEMBLY

(71) Applicant: GE Aviation Systems Limited, Cheltenham (GB)

(72) Inventors: Michael James Smith, Chadlington (GB); Alexander James Rainbow, Purton (GB); Christopher Andrew Leivers, Painswick (GB)

(73) Assignee: GE Aviation Systems Limited, Cheltenham (GB)

( * ) Notice: Subject to any disclaimer, the term of this patent is extended or adjusted under 35 U.S.C. 154(b) by 0 days.

(21) Appl. No.: 17/196,868

(22) Filed: Mar. 9, 2021

(65) Prior Publication Data
US 2021/0288505 A1   Sep. 16, 2021

(30) Foreign Application Priority Data
Mar. 13, 2020   (GB) ..................................... 2003686

(51) Int. Cl.
*H02J 4/00*   (2006.01)
*B64D 41/00*   (2006.01)

(52) U.S. Cl.
CPC ................ *H02J 4/00* (2013.01); *B64D 41/00* (2013.01); *B64D 2221/00* (2013.01); *H02J 2310/44* (2020.01)

(58) Field of Classification Search
None
See application file for complete search history.

(56) References Cited

U.S. PATENT DOCUMENTS

| | | | |
|---|---|---|---|
| 5,008,484 A | 4/1991 | Wagener | |
| 5,466,974 A * | 11/1995 | Sutrina | H02B 1/04 307/38 |
| 5,594,285 A * | 1/1997 | Wisbey | H02B 1/015 307/18 |
| 5,612,579 A | 3/1997 | Wisbey | |
| 6,002,580 A | 12/1999 | Levantine | |
| 6,315,580 B1 * | 11/2001 | Hurtubise | H01H 73/08 361/627 |
| 7,518,853 B2 | 4/2009 | Kato | |
| 9,011,167 B2 | 4/2015 | Fujiwara | |
| D757,655 S | 5/2016 | Murphy | |
| D760,655 S | 7/2016 | Murphy | |
| D760,658 S | 7/2016 | Perlaguri | |
| D760,660 S | 7/2016 | Murphy | |

(Continued)

FOREIGN PATENT DOCUMENTS

| | | |
|---|---|---|
| EP | 2425687 | 3/2012 |
| WO | 2010125426 | 11/2010 |

OTHER PUBLICATIONS

UKIPO; App No. 2003686.9; Combined Search and Examination Report under Sections 17 and 18(3) dated Sep. 11, 2020; pp. 1-7.

*Primary Examiner* — Rexford N Barnie
*Assistant Examiner* — Terrence R Willoughby
(74) *Attorney, Agent, or Firm* — Fitch, Even, Tabin & Flannery LLP

(57) ABSTRACT

A power distribution assembly that includes a planar substrate, a set of switchable elements arranged on the planar substrate, a conductive bus bar underlying the planar substrate and interconnected with the set of switchable elements, and a set of power connections. The power distribution assembly distributes power from a power source to one or more loads.

19 Claims, 6 Drawing Sheets

(56) References Cited

U.S. PATENT DOCUMENTS

| | | |
|---|---|---|
| 10,211,699 B2 | 2/2019 | Fukunaga |
| 2009/0200864 A1 | 8/2009 | Maier |
| 2009/0273234 A1 | 11/2009 | Wavering et al. |
| 2010/0285265 A1* | 11/2010 | Shinoda ................. B29B 11/16 428/80 |
| 2014/0185194 A1 | 7/2014 | Mills et al. |
| 2015/0137915 A1 | 5/2015 | Mills et al. |
| 2018/0166239 A1* | 6/2018 | Larson ................. H01H 47/001 |
| 2019/0069430 A1 | 2/2019 | Compton et al. |

\* cited by examiner

POWER DISTRIBUTION ASSEMBLY

TECHNICAL FIELD

The disclosure relates to a power distribution assembly, more specifically, a power distribution assembly having a substrate, switchable elements, and at least one bus bar.

BACKGROUND

Electrical power distribution systems manage the allocation of power from energy sources to electrical loads that consume the distributed electrical power. For example, in an aircraft, one or more turbine engines provide for propulsion of the aircraft and can further provide mechanical energy that ultimately powers a number of different accessories such as generators, starter/generators, permanent magnet alternators (PMAs), fuel pumps, and hydraulic pumps, e.g., equipment for functions needed on an aircraft other than propulsion. Contemporary aircraft can utilize electrical power that is distributed via electrical power distribution systems for electrical loads related to avionics, motors, and other electric equipment. The electrical distribution system for the aircrafts includes at least one power distribution assembly that can be used to route power from electrical generators to various electrical loads.

BRIEF DESCRIPTION

In one aspect, the disclosure relates to a power distribution assembly that includes a planar substrate, a set of switchable elements arranged in a single row on the planar substrate, a conductive bus bar underlying the planar substrate and interconnected with the set of switchable elements, and a set of power connections commonly arranged at an edge of the planar substrate, the edge extending along the set of switchable elements, each of the set of switchable elements connected with a respective subset of the set of power connections.

In another aspect, the disclosure relates to an aircraft power system that includes a power source, a portion of an aircraft frame, a power distribution assembly electrically coupled to the power source and coupled to the portion of the aircraft frame, a substrate supporting a set of switchable elements, the set of switchable elements arranged in a single row on the substrate and electrically coupled to a set of power connections wherein the set of power connections couples to at least one of the power source and at least one of a set of electrical loads, a conductive bus bar underlying the substrate and interconnected with at least a subset of the switchable elements, and a controller module configured to selectively energize at least a subset of the set of electrical loads with power from the power source, by way of operably controlling a switching of at least a subset of the switchable elements.

These and other features, aspects and advantages of the present disclosure will become better understood with reference to the following description and appended claims. The accompanying drawings, which are incorporated in and constitute a part of this specification, illustrate aspects of the disclosure and, together with the description, serve to explain the principles of the disclosure.

BRIEF DESCRIPTION OF THE DRAWINGS

A full and enabling disclosure of the present description, including the best mode thereof, directed to one of ordinary skill in the art, is set forth in the specification, which refers to the appended FIGS, in which.

DETAILED DESCRIPTION

Figure 1:
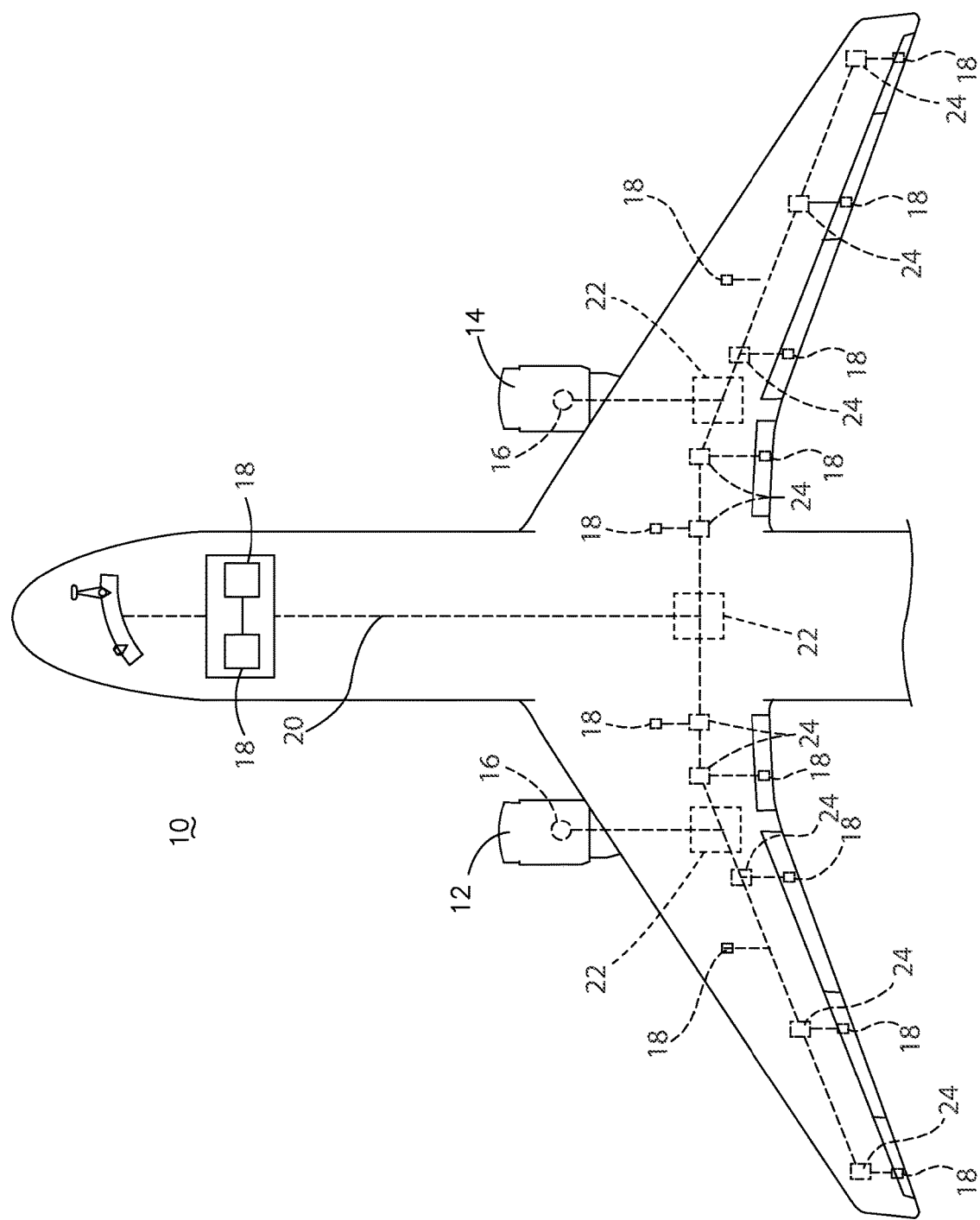
FIG. 1 is a perspective view of an aircraft having a power distribution assembly in accordance with various aspects described herein.

Aspects of the present disclosure are described herein in the context of a power distribution system, or components thereof, in an aircraft, which enables delivery of electrical power from an energy source, such as a turbine engine, jet fuel, hydrogen, battery or other power storage device, etc., to an electrical load or a device that otherwise consumes or utilizes power. However, it will be understood that the disclosure is not so limited and has general applicability to power distribution. For example, the disclosure can have applicability in other vehicles or engines, and can be used to provide benefits in industrial, commercial, and residential applications such as, but not limited to, locomotive, automobile, manufacturing facilities, or power generation and distribution facilities or infrastructure.

While "a set of" various elements will be described, it will be understood that "a set" can include any number of the respective elements, including only one element. Additionally, while terms such as "voltage", "current", and "power" can be used herein, it will be evident to one skilled in the art that these terms can be interrelated when describing aspects of the electrical circuit, or circuit operations.

Additionally, as used herein, the terms "radial" or "radially" refer to a direction away from a common center. For example, in the overall context of a turbine engine, radial refers to a direction along a ray extending between a center longitudinal axis of the engine and an outer engine circumference. The use of the terms "proximal" or "proximally," either by themselves or in conjunction with the terms "radial" or "radially," refers to moving in a direction toward another component, or a component being relatively closer to the other as compared to another reference point. All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are only used for identification purposes to aid the reader's understanding of the present disclosure, and do not create limitations, particularly as to the position, orientation, or use of aspects of the disclosure described herein.

Also, as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor, and the controller module or processor can perform processing on the value to determine a representative value or an electrical characteristic representative of said value. The term "satisfies" with respect to a threshold value is used herein to mean that a sensed value is equal to or greater than the threshold value, or being within a threshold value range (e.g. within tolerance). It will be understood that such a determination may easily be altered to be satisfied by a positive/negative comparison or a true/false comparison.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured, connected, or connectable to provide, enable, disable, or the like, an electrical connection between respective elements. Non-limiting examples of power distribution bus connections or disconnections can be enabled or operated by way of switching, bus tie logic, or any other connectors configured to enable or disable the energizing of electrical loads downstream of the bus.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein. The program can include a computer program product that can include machine-readable media for carrying or having machine-executable instructions or data structures stored thereon. Such machine-readable media can be any available media, which can be accessed by a general purpose or special purpose computer or other machine with a processor. Generally, such a computer program can include routines, programs, objects, components, data structures, algorithms, etc., that have the technical effect of performing particular tasks or implement particular abstract data types.

As used herein, a controllable switching element, or a "switch" is an electrical device that can be controllable to toggle between a first mode of operation, wherein the switch is "closed" enabling transmission of current from a switch input to a switch output, and a second mode of operation, wherein the switch is "open" disabling or preventing current from being transmitted between the switch input and switch output. In non-limiting examples, connections or disconnections, such as connections enabled or disabled by the controllable switching element, can be selectively configured to provide, enable, disable, or the like, an electrical connection between respective elements.

The exemplary drawings are for purposes of illustration only and the dimensions, positions, order and relative sizes reflected in the drawings attached hereto can vary.

Referring now to FIG. 1, an aircraft power system 8 for an aircraft 10 is illustrated as having at least one electrical power source. As shown, the aircraft 10 can include turbine engines, shown as a left engine system 12 and a right engine system 14. Alternatively, the aircraft power system 8 can have fewer or additional engine systems. The left and right engine systems 12, 14 can be substantially identical, and can further include at the least one power source, such as a set of respective generators 16. The left and right engine systems 12, 14 can further include another respective power source, such as a second electric machine or set of generators (not shown). Non-limiting aspects of the disclosure can be included wherein, for example, the left engine system 12 includes a first generator 16 as a primary power source and a secondary generator as a secondary, back-up, or redundant power source. Further, it is contemplated that any number or batteries, solar panels, or other energy storing or converting devices can be used to provide power to the aircraft power system 8.

The aircraft is shown further having a set of power-consuming components, or electrical loads 18, such as for instance, an actuator load, flight critical loads, and non-flight critical loads. The electrical loads 18 are electrically coupled with at least one of the generators 16 via a power distribution system including, for instance, power transmission lines 20, conductors, bus bars, a set of power distribution assemblies 22, 24, or the like. For example, the power distribution assemblies 22, 24 can include primary power distribution assemblies 22 and secondary power distribution assemblies 24. In one non-limiting example, the primary power distribution assemblies 22 can include switchable operations for delivering power from the power sources or generators 16 to large electrical loads 18 or to a set of secondary power distribution assemblies 24. In another non-limiting example, the secondary power distribution assemblies 24 can include switchable operations for delivering power from the power sources or the primary power distribution assemblies 22 to additional electrical loads 18. While primary and secondary power distribution assemblies 22, 24 are shown and described, any number of hierarchical distribution node arrangements can be included.

In the aircraft 10, the operating left and right engine systems 12, 14 provide mechanical energy which can be extracted, typically via a turbine engine spool, to provide a driving force for the generator 16. The generator 16, in turn, generates power, such as direct current (DC) power or alternating current (AC) power, and provides the generated power to the transmission lines 20. In non-limiting aspects of the disclosure, the transmission lines 20, or power distribution assemblies 22, 24 connected therewith, can, for example, provide switching, power conversion, or distribution management functions, as needed, in order to provide the desired electrical power to the electrical loads 18 for load operations.

Example power distribution management functions can include, but are not limited to, selectively enabling or disabling the delivery of power to particular electrical loads 18, depending on, for example, available power distribution supply, criticality of electrical load 18 functionality, or aircraft mode of operation, such as take-off, cruise, or ground operations. Additional management functions can be included. Furthermore, additional power sources for providing power to the electrical loads 18, such as emergency power sources, ram air turbine systems, starter/generators, or batteries, can be included, and can substitute for, or supplement, the power sources.

It will be understood that while one aspect of the disclosure is shown in an aircraft environment, the disclosure is not so limited and has general application to electrical power systems in non-aircraft applications, such as other mobile applications and non-mobile industrial, commercial, and residential applications. For example, while this description is directed toward a power system architecture in an aircraft, aspects of the disclosure can be further applicable to provide power, supplemental power, emergency power, essential power, or the like, in otherwise non-emergency operations, such as takeoff, landing, or cruise flight operations.

Furthermore, the number of, and placement of, the various components depicted in FIG. 1 are also non-limiting examples of aspects associated with the disclosure. For example, while various components have been illustrated with relative position of the aircraft 10 (e.g. the electrical loads 18 on the wings of the aircraft 10, etc.), aspects of the disclosure are not so limited, and the components are not so limited based on their schematic depictions. Additional aircraft 10 configurations are envisioned.

Figure 2:
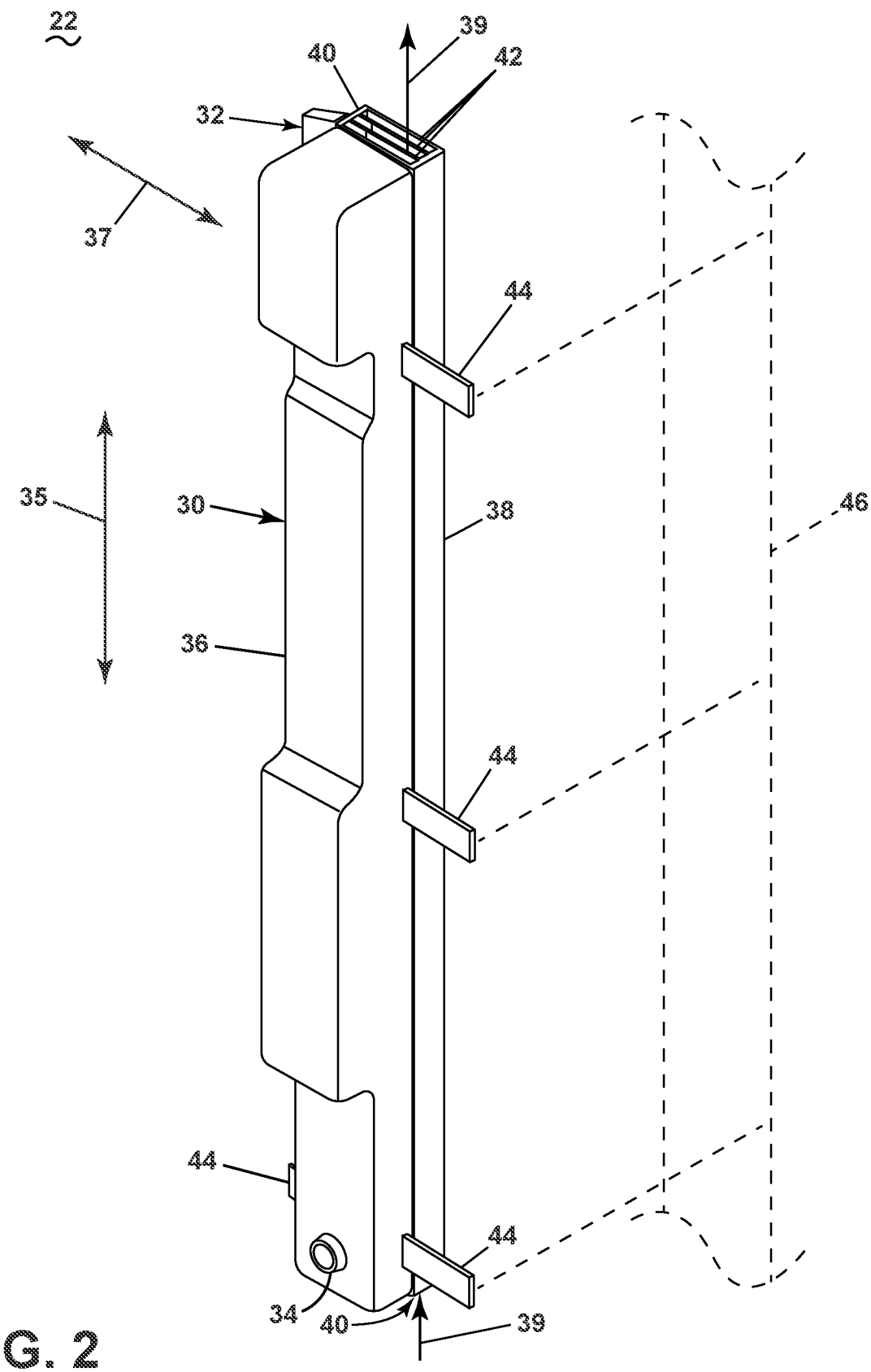
FIG. 2 is a perspective view of the power distribution assembly of the aircraft of FIG. 1, in accordance with various aspects described herein.

Referring now to FIG. 2, a schematic illustration is shown of the power distribution assembly 22 that can be utilized in the aircraft 10. While the power distribution assembly 22 is described, aspects of the disclosure can be applicable to any power distribution assembly 22, 24 envisioned. \The power distribution assembly 22 can include a housing 30 from which can protrude a set of power connections 32 or communications interface 34. The housing 30 can be made of one or more parts that are combined together or can be integrally formed as a single piece, and define a generally longitudinal assembly, defining a length in the longitudinal direction 35 that is much larger than an opposing width 37. As illustrated, the housing has a front portion 36 and rear portion 38. The front portion 36 and rear portion 38 can define opposing openings 40 and either opposing end in the longitudinal direction. A cooling fluid flow 39 can be allowed to flow through the housing 30 between the opposing openings 40. The cooling fluid flow 39 entering or exiting the housing 30 can be directed by one or more fins 42. In non-limiting examples, the fins 42 can provide increased or improved cooling capabilities, relative to the cooling fluid flow 39, or can provide structural containment for the housing 30, including preventing debris from entering or exiting the inside of the housing 30. It is contemplated that the cooling fluid flow 39 entering or exiting the housing 30 can be directed by one or more fans or conduits (not shown). Additionally, or alternatively, one or more of the opposing openings 40 can be closed by one or more end pieces formed with or formed independently of the housing 30. It is further contemplated that one or more of the opposing openings 40 can serve as an exhaust, through which air heated by one or more elements of the power distribution assembly 22 can be actively or passively exhausted.

Mounting assemblies are illustrated by mounting tabs 44. One or more portions of the mounting assemblies or the mounting tabs 44 can extend from an interior of the housing 30 or be formed with the housing 30. The mounting tabs 44 can be configured for coupling the power distribution assembly 22 to one or more structures or aircraft frames 46 (shown in dotted outline) in the aircraft 10. Mounting tabs 44 can include fixing elements, such as connectors, screws, clips, mechanical fastening elements, or the like (not shown). It is contemplated that the power distribution assembly 22 can be mounting using known method of fastening and that the mounting assemblies can include any number of elements used to secure the power distribution assembly 22 to the aircraft frame 46.

Figure 3:
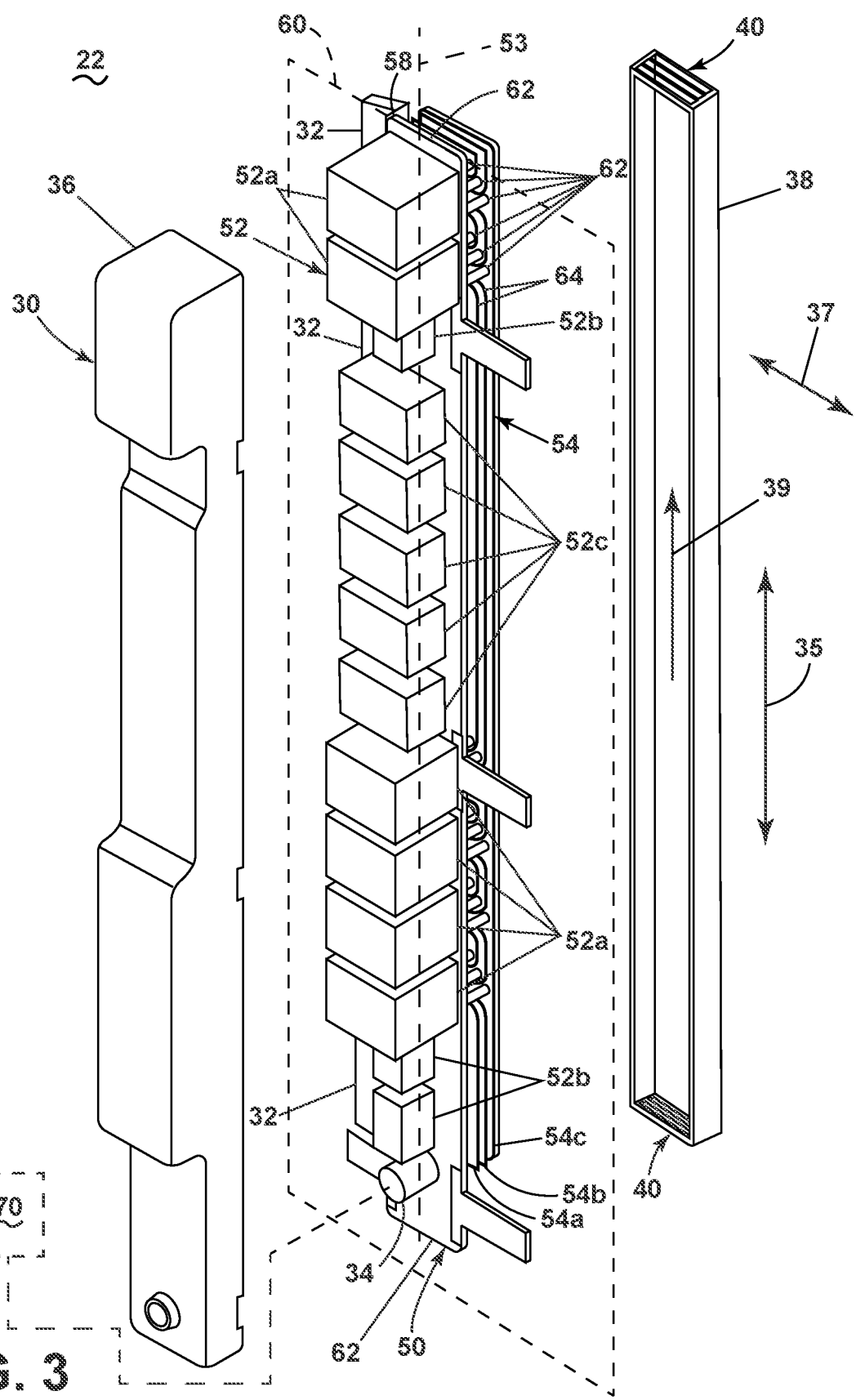
FIG. 3 a partially exploded view of the power distribution assembly of FIG. 2, in accordance with various aspects described herein.

FIG. 3 is a schematic illustration of the power distribution assembly 22 of FIG. 2, where the front portion 36 and the rear portion 38 of the housing 30 are exploded. The power distribution assembly 22 can include a substrate, illustrated as a planar substrate 50, a set of switchable elements 52 supported by the planar substrate 50, at least one conductive bus bar 54 underlying the planar substrate 50, and the set of power connections 32. By way of non-limiting example, the set of switchable elements 52 can be mounted to a front face 56 of the planar substrate 50. The set of switchable elements 52 can be arranged in juxtaposition or side-by-side, in a single row on the planar substrate 50. That is, each of the set of switchable elements 52 are adjacent to no more than 2 other switchable elements of the set of switchable elements 52. It is contemplated that the single row of the set of switchable elements 52 is a linear row extending along the longitudinal direction 35. That is, a line or centerline 53 can be drawn illustrating the linear row, where the centerline 53 overlaps at least a portion of each of the set of switchable elements 52. It is further contemplated that the centerline 53 can be any line or curve drawn generally in the longitudinal direction 35 that touches at least a portion of each of the set of switchable elements 52.

The set of power connections 32 can be commonly arranged at a side face or edge 58 of the planar substrate 50, that is, at an edge in the width direction 37. The set of power connections 32 can extend from the edge 58 along the set of switchable elements 52, so that each of the set of switchable elements 52 can be connected with a respective subset of the set of power connections 32.

The set of switchable elements 52 can include multiple sets of switchable elements illustrated, by example, as a first set of switchable elements 52a, a second set of switchable elements 52b, a third set of switchable elements 52c, and a fourth set of switchable elements 52d. Elements within the first, second, third, or fourth sets of switchable elements 52a, 52b, 52c, 52d can be, by way of non-limiting example, any combination of electromechanical contactors, solid state switching elements, transistors, transformers, circuit breakers, converters, switches, fuse links, relays, or voltage converters configured or adapted to switchably energize a downstream electrical load with power from a power source. While illustrated by way of example as similar, each element in the first, second, third, or fourth sets of switchable elements 52a, 52b, 52c, 52d is not required to be the same element.

One or more of the set of power connections 32 can serve as an electrical power input or output, relative to the set of switchable elements 52 associated with the respective subset of power connections 32. For example, the first set of switchable elements 52a can include a power contactor that receives a power input at the respectively connected subset of power connections 32. The first set of switchable elements 52a can be operably configured and controllably enabled to energize the at least one conductive bus bar 54 with power supplied to the power input. The third or fourth sets of switchable elements 52c, 52d can then selectively electrically connect or operably electrically connect the at least one conductive bus bar 54 to one or more of a respective subset of power connections 32 to provide electrical power output from the at least one conductive bus bar 54 to a respective set of electrical loads connected at the subset of power connectors. That is, the at least one conductive bus bar 54 interconnects with the set of switchable elements 52, 52a, 52b, 52c, 52d to provide electrical power output at the one or more power connections 32 or electrical loads. The second set of switchable elements 52b can be included at any point of the electrical power transfer and can electrically couple one or more of the first, second, third sets of switchable elements 52a, 52c, 52d to the power connections 32 or the at least one conductive bus bar 54. Stated another way, 52*b* can be a circuit breaker between first, third, or fourth sets of switchable elements 52*a*, 52*c*, 52*d* and the power connections 32 or the at least one conductive bus bar 54.

The planar substrate 50 can include a printed circuit board (PCB). The PCB can include communicative connections, such as PCB traces, used to carry or transmit control signals the set of switchable elements 52. Additionally, non-limiting aspects of the planar substrate 50 can provide selective electrical connection(s) between the power connections 32 used as the electrical power input and the at least one conductive bus bar 54. The planar substrate 50 can have one or more portions that are rigid or elastic. It is further contemplated that the planar substrate 50 can include portions that are rigid and other portions that are flexible.

Non-limiting aspects of the planar substrate 50 can include a planar structure in a radial direction as illustrated by a plane 60. Distal ends 66 of the planar substrate 50 can align with the opposing openings 40 of the housing 30. The housing 30 can couple to or otherwise overly at least a portion of the planar substrate 50.

The conductive bus bar 54 underlying the planar substrate 50 can include three conductive bus bars 54*a*, 54*b*, and 54*c*. The three conductive bus bars 54*a*, 54*b*, and 54*c* are generally parallel to the substrate, and spaced from each other such that they are in a non-conductive, parallel relationship. That is, each of the three conductive bus bars 54*a*, 54*b*, and 54*c* can define a plane that is generally parallel to the plane 60 defined by the planar substrate 50. The term "generally parallel," as used herein implies that a line or a plane drawn at 90 degrees with respect to the plane 60 will strike the planes defined by the three conductive bus bars 54*a*, 54*b*, and 54*c* at an angle between and including 80 degrees to 100 degrees.

The three conductive bus bars 54*a*, 54*b*, and 54*c* underlying the planar substrate 50 include a plurality of conductive posts 62, wherein at least one of the plurality of the conductive posts 62 passes through a non-contacting or non-conductive recess or opening 64 in at least one of the three conductive bus bars.

The communications interface 34 can be disposed on the front face 56 of the planar substrate 50. The communications interface 34 can be adapted to receive and communicate instructions from a remote power distribution controller module 70 for enabling switchable operation of the set of switchable elements 52. That is, the communications interface 34 can communicate with the planar substrate 50 to operably control the set of switchable elements 52. Optionally, the communications interface 34 can provide electrical power to the planar substrate 50 or PCB. While illustrated as a single communications interface 34, any number of communications interfaces is contemplated.

The power distribution assembly 22 is illustrated as a 3-phase alternating current (AC) power distribution assembly. In operation, the power source, such as a generator 16 provides electrical power via the transmission lines 20 to the power distribution assembly 22, 24. The electrical power provided to the power distribution assembly 22, 24 is received at a subset of the set of power connections 32 that correspond to the first set of switchable elements 52*a*. The remote power distribution controller module 70 communicates, via the communications interface 34, to the planar substrate 50 PCB and activates at least the first set of switchable elements 52*a*. Activation of the first set of switchable elements 52*a* can, for example, energize at least a subset of the three conductive bus bars 54*a*, 54*b*, 54*c*.

Before, after, or during the activation of the first set of switchable elements 52*a*, the remote power distribution controller module 70 can activate the second set of switchable elements 52*b*, via the communications interface 34 to the planar substrate 50 or PCB. By way of example, the second set of switchable elements 52*b* can include circuit breakers between the first set of switchable elements 52*a* and the three conductive bus bars 54*a*, 54*b*, 54*c*. Additionally or alternatively, the second set of switchable elements 52*b* can include circuit breakers between the three conductive bus bars 54*a*, 54*b*, 54*c* and at least one component of the third, or fourth sets of switchable elements 52*c*, 52*d*. It is further contemplated that the second set of switchable elements 52*b* can include circuit breakers between any number of switchable elements 52.

Before, after, or during the activation of the first set of switchable elements 52*a* or the second set of switchable elements 52*b*, the remote power distribution controller module 70 activate any one or more elements of the third or fourth sets of switchable elements 52*c*, 52*d*. Activation of one or more of the third or fourth sets of switchable elements 52*c*, 52*d* can allow electrical power to flow from the three conductive bus bars 54*a*, 54*b*, 54*c* to the subset of the set of power connections 32 that correspond with the activated switchable element(s) of the third or fourth sets of switchable elements 52*c*, 52*d*. The subset of the set of power connections 32 that correspond with the activated switchable element(s) of the third or fourth sets of switchable elements 52*c*, 52*d* can electrically couple the set of power distribution assembly 22 to one or more of the electrical loads 18. That is, when the correct combination or subset of the set of switchable elements 52 are activated by the remote power distribution controller module 70, electrical power from the power source 12, 14, 16 can be selectively coupled to one or more electrical loads 18.

During operation of the power distribution assembly 22, heat can be generated within the housing 30 due to the power elements being operated. As explained, cooling fluid can flow between openings 40 to enable cooling of the power electronics (such as the set of switchable elements 52) within the housing 30. In aspects of the disclosure where the power distribution assembly 22 is or mounted with the longitudinal direction 35 vertically arranged, heat generated can be naturally expelled upward and out the opening by the convective cooling fluid flow 39. In another non-limiting aspect of the disclosure, forced air, or another active cooling fluid flow 39, can be included.

Figure 4:
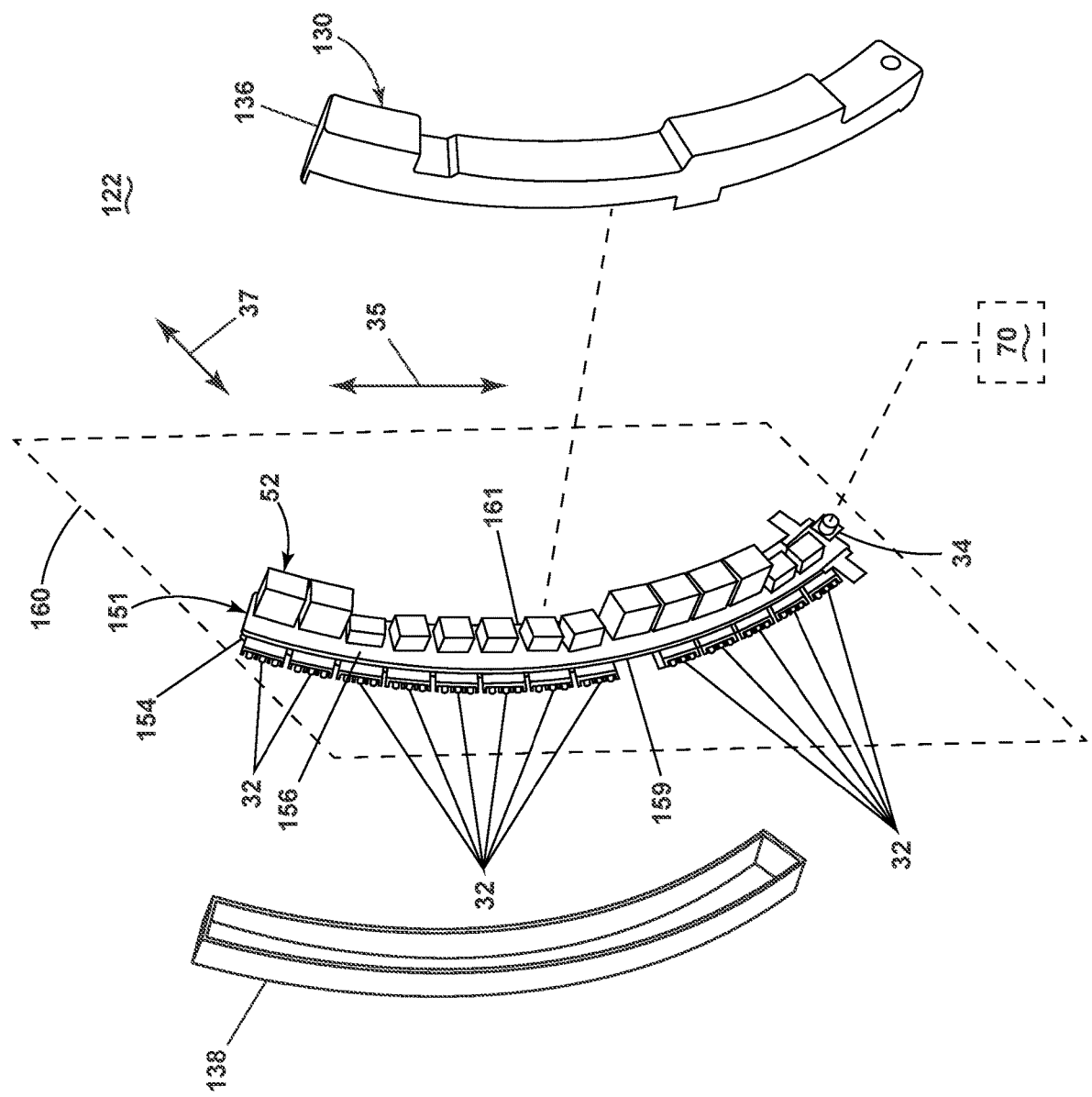
FIG. 4 is a perspective view of a variation of the power distribution assembly of the aircraft of FIG. 1, in accordance with various aspects described herein.

FIG. 4 is another example of a power distribution assembly 122. The power distribution assembly 122 is similar to the power distribution assembly 22, therefore, like parts will be identified with like numerals increased by 100, with it being understood that the description of the like parts of the power distribution assembly 22 applies to the power distribution assembly 122, unless otherwise noted. A difference between the power distribution assembly 22 and the power distribution assembly 122 can include wherein the power distribution assembly 122 can include a generally arcuate shape.

A front portion 136 and a rear portion 138 of an arcuate housing 130 have been exploded to show the internal components of the power distribution assembly 122 in greater detail. The power distribution assembly 122 can include a substrate, illustrated as an arcuate planar substrate 150, the set of switchable elements 52, at least one conductive bus bar 154 underlying the arcuate planar substrate 150, and a set of power connections 32. The arcuate planar substrate 150 can be is planar in a radial direction, such as the previously-described width direction 37, and as illustrated by a schematic plane 160 (dotted).

By way of non-limiting example, the set of switchable elements 52 can be mounted to a front face 156 of the arcuate planar substrate 150. As illustrated, the set of power connections 32 can be commonly arranged at a side or lateral face or radially outward side 159 of the arcuate planar substrate 150. Alternatively, it is contemplated that the set of or a portion of the set of power connections 32 can be commonly arranged at the radially inner side 161. The set of power connections 32 can extend from the radially outward side 159 or the radially inner side 161 along the set of switchable elements 52, so that each of the set of switchable elements 52 can be connected with a respective subset of the set of power connections 32, as described herein.

The arcuate planar substrate 150 can include a printed circuit board (PCB), as described. The PCB can be used to enable control the set of switchable elements 52. That is, the PCB can provide communicative connections to enable the selective switchable electrical connection(s) between the power connections 32 used as the electrical power input or output and the at least one conductive bus bar 154 via controlling the set of switchable elements 52 corresponding to the power connections 32 used as the electrical power input or output.

The communications interface 34 can be disposed on the front face 156 of the planar substrate 150. The communications interface 34 can be adapted to receive and communicate instructions from a remote power distribution controller module 70 for operating the set of switchable elements 52. Optionally, the communications interface 34 can provide electrical power to the planar substrate 150 or PCB. While illustrated as a single communications interface 34, any number of communications interfaces is contemplated.

Figure 5:
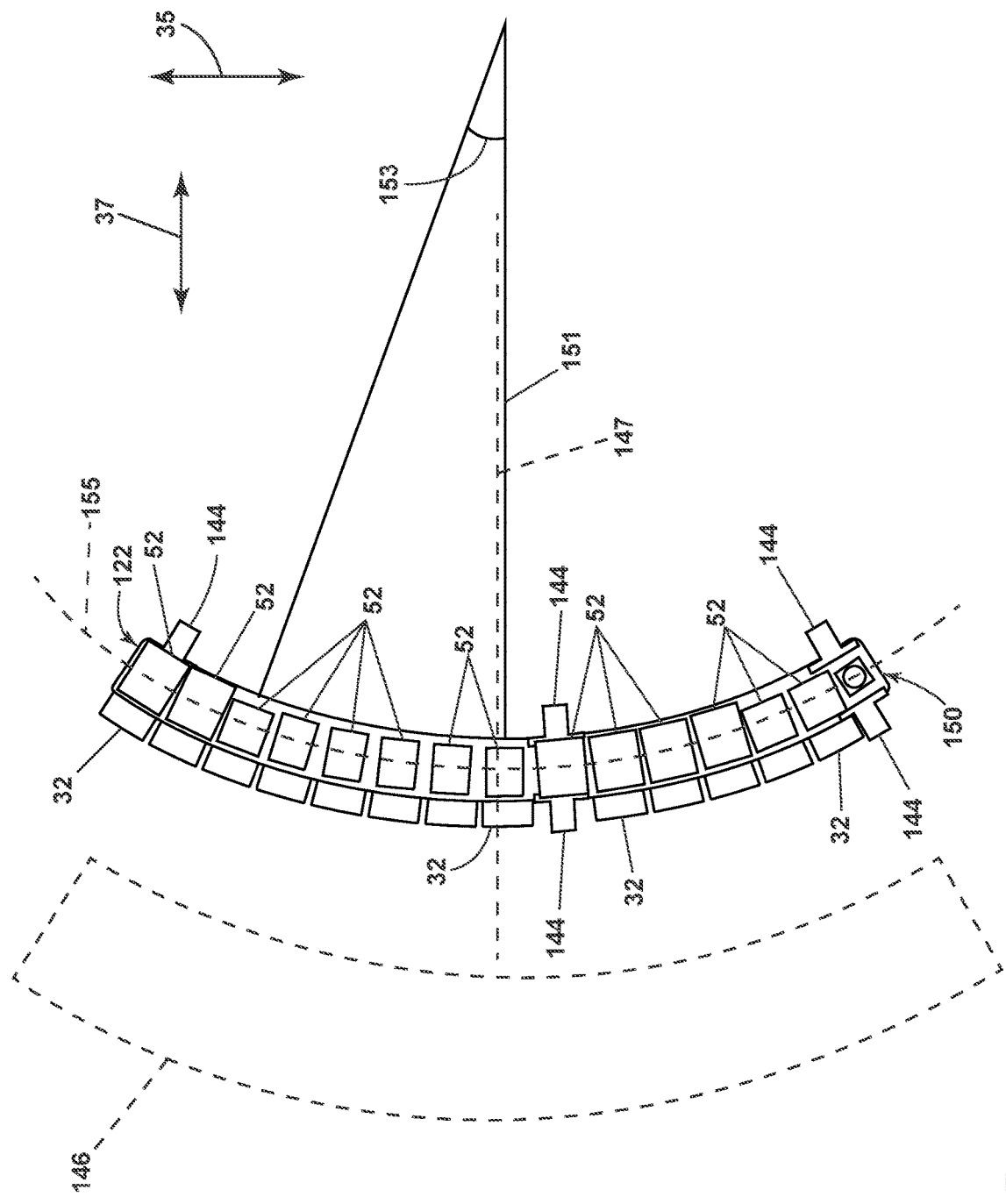
FIG. 5 is a front view of the power distribution assembly of FIG. 4, in accordance with various aspects described herein.

FIG. 5 is a front view of the power distribution assembly 122 to further illustrate the arcuate planar substrate 150. The arcuate planar substrate 150 can, for example, have a radius of curvature 151, including or defining, for example, an angle 153 formed between the radius of curvature 151 and one the set of switchable elements 52, the planar substrate 150, or the like. The angle 153 is greater than 0 degrees and less than 360 degrees.

The set of switchable elements 52 can be arranged side-by-side forming one or more arcs or curves. That is, as illustrated, the set of switchable elements 52 can form a single arcuate row on the arcuate planar substrate 150, so that an arcuate row, illustrate by way of example as line or centerline 155, of the arcuate planar substrate 150 overlaps at least a portion of each of the set of switchable elements 52. It is further contemplated that the single arcuate row of the set of switchable elements 52 and the arcuate planar substrate 150 have a common arcuate center or radius of curvature.

Mounting assemblies are illustrated by mounting tabs 144. The mounting tabs 144 can couple the power distribution assembly 122 to one or more structures or frames in the aircraft 10. By way of non-limiting example, the mounting tabs 144 can include fixing elements (not shown) to secure, couple, or otherwise attach the power distribution assembly 122 to an aircraft frame, illustrated as an arcuate frame 146 of the aircraft 10. It is contemplated that the power distribution assembly 122 can be mounting using known method of fastening and that the mounting assemblies can include any number of elements used to secure the power distribution assembly 122.

The arc of the arcuate planar substrate 150 can be shaped, oriented, keyed, or otherwise formed to match the corresponding arcuate frame 146 of the aircraft 10. That is, the at least a portion of the arcuate frame 146 can have a frame radius of curvature 147 that is greater than zero and less than or equal to 50% of the radius of curvature 151 of the arcuate planar substrate 150. While illustrated as a single curve, the arcuate planar substrate 150 or the arcuate frame 146 can include any number of linear and non-linear or curved portions.

Figure 6:
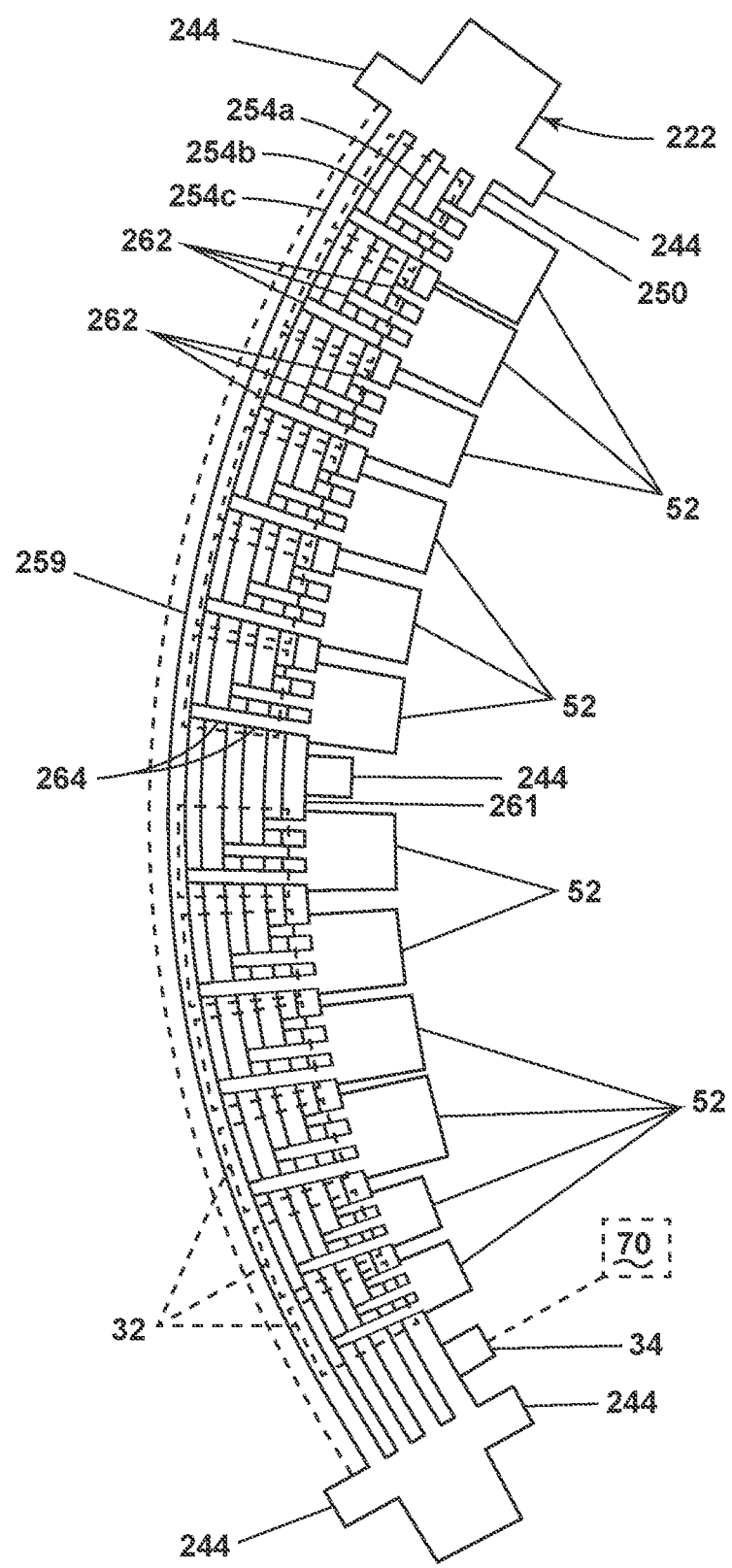
FIG. 6 is a front view of another variation of the power distribution assembly of the aircraft of FIG. 1, in accordance with various aspects described herein.

FIG. 6 is yet another example of a power distribution assembly 222. The power distribution assembly 222 is similar to the power distribution assembly 22, 122, therefore, like parts will be identified with like numerals further increased to 200, with it being understood that the description of the like parts of the power distribution assembly 22, 122 applies to the power distribution assembly 222, unless otherwise noted. One non-limiting difference between the power distribution assembly 222 and the power distribution assemblies 22, 122 can include that the power distribution assembly 222 is arranged or configured such that a set of switchable elements 52 are arranged on a radially inward surface of the power distribution assembly 222.

The power distribution assembly 222 can include an arcuate substrate, illustrated as an arcuate planar substrate 250, the set of switchable elements 52, at least one conductive bus bar 254 underlying the arcuate planar substrate 250, and a set of power connections 32 (show in dotted outline for better understanding of the underlying structure). The power distribution assembly 222 can further include mounting assemblies illustrated as mounting tabs 244.

By way of non-limiting example, the arcuate planar substrate 250 is planar in a curved or circumferential direction. That is, the arcuate planar substrate 250 can be planar or generally spaced at a consistent radial distance relative to the front and back sides of the power distribution assembly 222. The arcuate planar substrate 250 defines a surface extending in the circumferential direction, and wherein each of the set of switchable elements are arranged on the surface, illustrated as a radially inner surface or radially inner side 261. Alternatively, it is contemplated that the set of or a portion of the set of switchable elements 52 can be arranged at the radially outward side 259 of the arcuate planar substrate 250 or the power distribution assembly 222.

The set of power connections 32 are illustrated, by way of non-limiting example as extending from a back side of the power distribution assembly 222. It is contemplated that one or more of the set of power connections 32 can extend from the front side or face of the power distribution assembly 222. It is further contemplated that one or more of the set of power connections 32 can extend from the radially outward side 259 or the radially inner side 261. The set of power connections 32 can be arranged along the set of switchable elements 52, so that each of the set of switchable elements 52 can be connected with a respective subset of the set of power connections 32.

The arcuate planar substrate 250 can include a printed circuit board (PCB), as described herein. The conductive bus bar 254 underlying the arcuate planar substrate 250 can include three arcuate conductive bus bars 254a, 254b, and 254c. The three conductive bus bars 254a, 254b, and 254c are generally spaced at a consistent radial distance relative to the arcuate planar substrate 250, and are constructed having a similarly arc center with the arcuate planar substrate 250. It is further contemplated the at radius of curvature of the three conductive bus bars 254a, 254b, and 254c is greater than zero and less than or equal to 50% of the radius of curvature of the arcuate planar substrate 250. It is contemplated that electrically insulating components can be added, for example, around or between the three conductive bus bars 254a, 254b, or 254c, the set of switchable elements 52, or the power connections 32.

The three conductive bus bars 254a, 254b, and 254c underlying the planar substrate 250 include a plurality of conductive posts 262. Optionally, at least one of the plurality of the conductive posts 262 passes through one or more recesses or openings 264 in at least one of the three conductive bus bars 254a, 254b, 254c.

The communications interface 34 can be disposed on the radially inner side 261 or the arcuate planar substrate 250, providing communication between the arcuate planar substrate 250 and a remote power distribution controller module 70.

Benefits of aspects of the disclosure include a space savings advantage. Traditionally, power distribution assemblies are a wide rectangular shape, having a width somewhat comparable to their length. As disclosed herein, the power distribution assembly can have a narrower rectangular shape, allowing for better positioning in the aircraft.

Additional benefits are realized when the power distribution assembly is curved to complement the aircraft frame. Traditionally, when the wide rectangular power distribution system is mounted in a rounded portion of the aircraft, the result is unused space. The present disclosure illustrates how a power distribution assembly to curve and complement the aircraft frame to which it is mounted. This reduces the unused space in the aircraft allowing for a more compact assembly. Further, the previously utilized space now unoccupied by the relocated power distribution assembly can be utilized by other or alternative componentry.

Further, additional benefits of the disclosure include easier access to the power connectors. For example, instead of reaching into the unused space between a rounded frame and wide rectangular power distribution assembly, the power connectors can be located at the edge of a narrow rectangular or curved power distribution assembly, providing easier access. In some instances, the set of power connections at a radial edge can be physically located closer to conductive wiring connecting the power source or the electrical load with the set of power connections. This closer proximity results in a reduction of interconnecting transmission wire lengths with the assembly output, and hence a corresponding weight reduction due to wiring.

This written description uses examples to disclose embodiments of the disclosure, including the best mode, and also to enable any person skilled in the art to practice embodiments of the disclosure, including making and using any devices or systems and performing any incorporated methods. The patentable scope of the disclosure is defined by the claims, and can include other examples that occur to those skilled in the art. By way of non-limiting example, the number of conductive bus bars, type of power connections, or set of switchable elements can be interchanged to accommodate and distribute single-phase AC or DC. Further, any number of conductive bus bars, type of power connections, or set of switchable elements can be used to provide one or more of single-phase AC, DC, 3 phase AC power, or a conversion therebetween. Such other examples are intended to be within the scope of the claims if they have structural elements that do not differ from the literal language of the claims, or if they include equivalent structural elements with insubstantial differences from the literal languages of the claims.

Further aspects of the disclosure are provided by the subject matter of the following clauses:

A power distribution assembly, comprising a planar substrate, a set of switchable elements arranged in a single row on the planar substrate, a conductive bus bar underlying the planar substrate and interconnected with the set of switchable elements, and a set of power connections commonly arranged at an edge of the planar substrate, the edge extending along the set of switchable elements, each of the set of switchable elements connected with a respective subset of the set of power connections.

The power distribution assembly of any of the preceding clauses wherein the set of switchable elements are further arranged in a linear row on the planar substrate.

The power distribution assembly of any of the preceding clauses wherein the planar substrate is an arcuate planar substrate.

The power distribution assembly of any of the preceding clauses wherein the set of switchable elements are arranged in a single arcuate row on the arcuate planar substrate.

The power distribution assembly of any of the preceding clauses wherein the single arcuate row and the arcuate planar substrate have a common arcuate center.

The power distribution assembly of any of the preceding clauses wherein the arcuate planar substrate is planar in a radial direction.

The power distribution assembly of any of the preceding clauses wherein the arcuate planar substrate defines a surface extending in the radial direction, and wherein each of the set of switchable elements are arranged on the surface.

The power distribution assembly of any of the preceding clauses wherein the arcuate planar substrate is shaped to match a radius of curvature of an arcuate frame of an aircraft.

The power distribution assembly of any of the preceding clauses wherein the set of power connections are commonly arranged at a radially outward side of the arcuate planar substrate.

The power distribution assembly of any of the preceding clauses wherein the set of switchable elements includes at least one of electromechanical contactors or solid state switching elements.

The power distribution assembly of any of the preceding clauses, further comprising a communications interface disposed on a surface of the planar substrate, the communications interface adapted to receive and communicate instructions from a remote power distribution controller module for operating the set of switchable elements.

The power distribution assembly of any of the preceding clauses wherein the planar substrate is a printed circuit board.

The power distribution assembly of any of the preceding clauses, further comprising a housing overlying the planar substrate, the set of switchable elements, and the conductive bus bar, wherein the housing further defines opposing openings at distal ends of the planar substrate.

The power distribution assembly of any of the preceding clauses wherein the opposing openings allow cooling fluid flow between the opposing openings.

An aircraft power system, comprising a power source, a portion of an aircraft frame, a power distribution assembly electrically coupled to the power source and coupled to the portion of the aircraft frame, a substrate supporting a set of switchable elements, the set of switchable elements arranged in a single row on the substrate and electrically coupled to a set of power connections wherein the set of power connections couples to at least one of the power source and at least one of a set of electrical loads, a conductive bus bar underlying the substrate and interconnected with at least a subset of the switchable elements, and a controller module configured to selectively energize at least a subset of the set of electrical loads with power from the power source, by way of operably controlling a switching of at least a subset of the switchable elements.

The aircraft power system of any of the preceding clauses, wherein the portion of the aircraft frame is an arcuate frame and the substrate is an arcuate substrate that is shaped to match the arcuate frame.

The aircraft power system of any of the preceding clauses, wherein the arcuate substrate includes a radially outward side and a radially inner side, where the set of switchable elements or the set of power connections are arranged on the radially outward side or the radially inner side of the arcuate substrate.

The aircraft power system of any of the preceding clauses, wherein the set of switchable elements or the set of power connections are arranged in a single row on the radially outward side or the radially inner side of the arcuate substrate.

The aircraft power system of any of the preceding clauses, wherein the conductive bus bar underlying the substrate is three conductive bus bars underlying the substrate wherein the three conductive bus bars are generally parallel to the substrate.

The aircraft power system of any of the preceding clauses, wherein the three conductive bus bars underlying the substrate include a plurality of conductive posts, wherein at least one of the plurality of the conductive posts passes through a recess or opening in at least one of the three conductive bus bars.

What is claimed is:

1. A power distribution assembly disposed in an aircraft, the power distribution assembly comprising:
   an elongated substrate having an elongated footprint;
   a single set of switchable elements, each element of the single set of switchable elements arranged in only a single row along a length of the elongated substrate, the single set of switchable elements being the only switchable elements disposed on the elongated substrate;
   a channel formed under the elongated substrate and extending along the elongated footprint of the elongated substrate;
   a plurality of conductive bus bars disposed in the channel and underlying the elongated substrate and interconnected with the single set of switchable elements; and
   a set of power connections commonly arranged at an edge of the elongated substrate, the edge extending along the single set of switchable elements, each of the single set of switchable elements connected with a respective subset of the set of power connections, each of the plurality of conductive bus bars extending along the length of the elongated substrate and being disposed in a stacked configuration wherein adjacent ones of the plurality of conductive bus bars are arranged in spaced relation to allow convective cooling of the plurality of conductive bus bars to occur.

2. The power distribution assembly of claim 1, wherein the elongated substrate is an arcuate elongated substrate.

3. The power distribution assembly of claim 2, wherein the single set of switchable elements are arranged in a single arcuate row on the arcuate elongated substrate.

4. The power distribution assembly of claim 3, wherein the single arcuate row and the arcuate elongated substrate have a common arcuate center.

5. The power distribution assembly of claim 2, wherein the arcuate elongated substrate is planar in a radial direction.

6. The power distribution assembly of claim 5, wherein the arcuate elongated substrate defines a surface extending in the radial direction, and wherein each of the set of switchable elements are arranged on the surface.

7. The power distribution assembly of claim 2, wherein the arcuate elongated substrate is shaped to match a radius of curvature of an arcuate frame of the aircraft.

8. The power distribution assembly of claim 2, wherein the set of power connections are commonly arranged at a radially outward side of the arcuate elongated substrate.

9. The power distribution assembly of claim 1, wherein the single set of switchable elements includes at least one of electromechanical contactors or solid state switching elements.

10. The power distribution assembly of claim 1, further comprising a communications interface disposed on a surface of the elongated substrate, the communications interface adapted to receive and communicate instructions from a remote power distribution controller module for operating the single set of switchable elements.

11. The power distribution assembly of claim 1, wherein the elongated substrate is a printed circuit board.

12. The power distribution assembly of claim 1, further comprising a housing overlying the elongated substrate, the single set of switchable elements, and the plurality of conductive bus bars, wherein the housing further defines opposing openings at distal ends of the elongated substrate.

13. The power distribution assembly of claim 12, wherein the opposing openings allow cooling fluid flow between the opposing openings.

14. An aircraft power system, comprising:
   a power source;
   a portion of an aircraft frame;
   a power distribution assembly electrically coupled to the power source and coupled to the portion of the aircraft frame;
   an elongated substrate having an elongated footprint and supporting a single set of switchable elements without any other switchable elements, each element of the single set of switchable elements arranged in only a single row along a length of the elongated substrate and electrically coupled to a set of power connections wherein the set of power connections couples to at least one of the power source and at least one of a set of electrical loads;
   a channel formed under the elongated substrate and extending along the elongated footprint of the elongated substrate;
   a plurality of conductive bus bars disposed in the channel and underlying the elongated substrate and interconnected with at least a subset of the single set of switchable elements, each of the plurality of conductive bus bars extending along the length of the elongated substrate and being disposed in a stacked configuration wherein adjacent ones of the plurality of conductive bus bars are arranged in spaced relation to allow convective cooling of the plurality of conductive bus bars to occur; and
   a controller module configured to selectively energize at least a subset of the single set of electrical loads with power from the power source, by way of operably controlling a switching of at least a subset of the single set of switchable elements.

15. The aircraft power system of claim 14, wherein the portion of the aircraft frame is an arcuate frame and the elongated substrate is an arcuate substrate that is shaped to match the arcuate frame.

16. The aircraft power system of claim 15, wherein the arcuate substrate includes a radially outward side and a radially inner side, where the single set of switchable elements or the set of power connections are arranged on the radially outward side or the radially inner side of the arcuate substrate.

17. The aircraft power system of claim 16, wherein the single set of switchable elements or the set of power connections are arranged in the single row on the radially outward side or the radially inner side of the arcuate substrate.

18. The aircraft power system of claim 14, wherein the plurality of conductive bus bars comprises three conductive bus bars.

19. The aircraft power system of claim 18, wherein the three conductive bus bars include a plurality of conductive posts, wherein at least one of the plurality of the conductive posts passes through a recess or opening in at least one of the three conductive bus bars.

* * * * *